United States Patent
Varnica et al.

(10) Patent No.: US 8,868,999 B1
(45) Date of Patent: Oct. 21, 2014

(54) SYSTEMS AND METHODS FOR ERASURE CORRECTION OF ITERATIVE CODES

(75) Inventors: Nedeljko Varnica, San Jose, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 243 days.

(21) Appl. No.: 13/336,192

(22) Filed: Dec. 23, 2011

Related U.S. Application Data

(60) Provisional application No. 61/430,444, filed on Jan. 6, 2011.

(51) Int. Cl.
*H03M 13/00* (2006.01)
*H03M 13/11* (2006.01)
*H03M 13/37* (2006.01)

(52) U.S. Cl.
CPC ........ *H03M 13/373* (2013.01); *H03M 13/1191* (2013.01)
USPC ............................ 714/752; 714/784; 714/785

(58) Field of Classification Search
CPC ...................................................... H03M 13/373
USPC .......................................... 714/758, 784, 785
See application file for complete search history.

(56) References Cited

U.S. PATENT DOCUMENTS

| | | | | |
|---|---|---|---|---|
| 5,379,305 | A * | 1/1995 | Weng | 714/774 |
| 6,654,926 | B1 * | 11/2003 | Raphaeli et al. | 714/780 |
| 7,096,409 | B2 * | 8/2006 | Banks | 714/784 |
| 7,165,209 | B2 * | 1/2007 | LaBerge | 714/790 |
| 7,418,644 | B2 * | 8/2008 | Smith et al. | 714/755 |
| 7,451,385 | B2 * | 11/2008 | Ha et al. | 714/800 |
| 7,453,959 | B2 * | 11/2008 | Kim et al. | 375/340 |
| 7,555,697 | B2 * | 6/2009 | Chang et al. | 714/759 |
| 2010/0146372 | A1 * | 6/2010 | Tomlinson et al. | 714/780 |

* cited by examiner

*Primary Examiner* — Esaw Abraham

(57) ABSTRACT

Systems and methods are provided for correcting erasures in received codewords. In certain implementations of the system and methods, a codeword transmitted over a channel is processed to identify and/or mark a set of locations in the codeword corresponding to erased codeword symbols. A decoder selects a subset of locations from the set of locations in the codeword and selects a sequence of symbol values from a plurality of symbol value sequences. The decoder replaces each of the erased symbols in the subset of locations with a corresponding symbol value from the sequence of symbols values to produce a modified codeword and attempts to decode the modified codeword.

20 Claims, 8 Drawing Sheets

SYSTEMS AND METHODS FOR ERASURE CORRECTION OF ITERATIVE CODES

CROSS REFERENCE TO RELATED APPLICATION

This application claims the benefit under 35 U.S.C. §119 (e) of U.S. Provisional Application No. 61/430,444, filed on Jan. 6, 2011, which is incorporated herein by reference in its respective entirety.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

The present disclosure relates generally to data decoding, and more particularly to iterative decoders for data encoded with a low density parity check (LDPC) encoder.

LDPC codes and decoders that are used to decode LDPC codes may be used in numerous applications and devices. For example, data storage, satellite communications, wireless communications, wire-line communications, and power-line communications are applications that may each use LDPC codes and LDPC decoders. Devices such as digital camera flash memory storage, satellites, mobile phones, and other mobile devices may also each use LDPC codes and LDPC decoders.

LDPC codes may be used for correcting errors and erasures in information transmitted in a noisy communications or data storage channel. The information may be encoded (by a LDPC encoder) prior to transmission and then subsequently decoded (by a LDPC decoder) when received. Traditional LDPC decoders typically decode codewords that are comprised of non-erased bits. However, in addition to errors, or in presence of no errors, sometimes a set of symbols in the codeword has been erased such that reduction of this set of erased symbols is not easily achievable using standard LDPC algorithms such as message passing algorithms or linear programming methods.

SUMMARY

In accordance with an embodiment of the invention, a decoder is provided. In certain implementations, the decoder is configured to receive a codeword transmitted over a channel and process the codeword to identify and/or mark a set of locations in the codeword corresponding to erased codeword symbols. The decoder is further configured to select a subset of locations from the set of locations in the codeword and select a sequence of symbol values from a plurality of symbol value sequences. The decoder is also configured to replace each of the erased symbols in the subset of locations with a corresponding symbol value from the sequence of symbols values to produce a modified codeword and attempt to decode the modified codeword.

In certain implementations, the decoder is configured to attempt to decode the modified codeword using an LDPC code. In certain implementations, if the decoder determines that the decoding attempt fails, the decoder selects another sequence of symbol values, replaces each of the erased symbols in the subset of locations with a corresponding symbol value from the other sequence of symbol values to produce another modified codeword, and attempts to decode the other modified codeword.

In certain implementations, if the decoder determines that the decoding attempt fails, the decoder selects another subset of locations from the set of locations in the codeword and selects another sequence of symbol values from a plurality of symbol value sequences. The decoder replaces each of the erased symbols in the other subset of locations with a corresponding symbol value from the other sequence of symbol values to produce another modified codeword and attempts to decode the other modified codeword.

In accordance with another embodiment of the invention, techniques are provided for correcting erasures in received codewords. In certain implementations of these techniques, a codeword transmitted over a channel is received and processed to identify and/or mark a set of locations in the codeword corresponding to erased codeword symbols. A processor selects a subset of locations from the set of locations in the codeword and selects a sequence of symbol values from a plurality of symbol value sequences. The processor replaces each of the erased symbols in the subset of locations with a corresponding symbol value from the sequence of symbols values to produce a modified codeword and attempts to decode the modified codeword.

In certain implementations of these techniques, the processor attempts to decode the modified codeword using an LDPC code. In certain implementations of these techniques, if it is determined that the decoding attempt fails, another sequence of symbol values from the plurality of symbol value sequences is selected to replace the sequence of symbol values and produce another modified codeword. An attempt is made to decode the other modified codeword.

In certain implementations of these techniques, if it is determined that the decoding attempt fails, another subset of locations from the set of locations in the codeword is selected, and another sequence of symbol values from the plurality of symbol value sequences is selected. Each of the erased symbols in the other subset of locations is replaced with the other sequence of symbol values to produce another modified codeword, and an attempt is made to decode the other modified codeword.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

To provide an overall understanding of the invention, certain illustrative embodiments will now be described, including a decoder that decodes a codeword with erased symbols. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope thereof.

Figure 1:
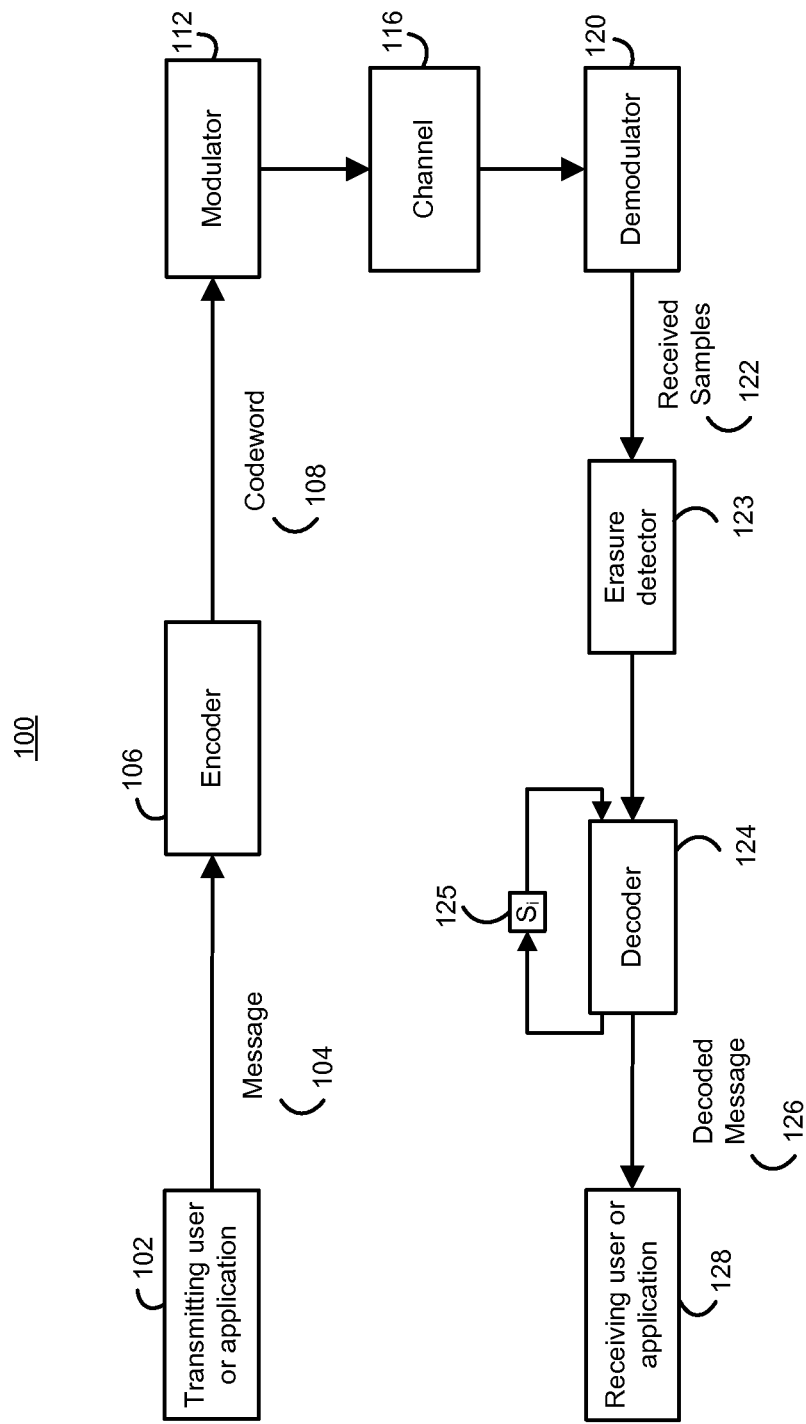
FIG. 1 shows an illustrative communications system including a decoder for decoding a codeword that includes erased symbols, according to an illustrative embodiment of the invention.

FIG. 1 shows an illustrative communications system, in which a decoder decodes a codeword that includes erased symbols. Communications system 100 is used to transmit information from transmitting user or application 102 to receiving user or application 128. Transmitting user or application 102 represents an object or entity that produces information. For example, transmitting user or application 102 may correspond to a software program in a computer system or to a component of a wireless communications transmitter in a radio system. Transmitting user or application 102 produces information in the form of a data stream, and the data stream may be represented by a sequence of symbol values that have been pre-processed by, for example, a source encoder (not shown in FIG. 1). The information produced by transmitting user or application 102 may correspond to voice information, video information, financial information, or any other type of information that may be represented in digital or analog form, and the data stream produced by transmitting user or application 102 may be a digital data stream.

Transmitting user or application 102 may segment or otherwise divide the data stream into blocks of a fixed length of k symbols. In particular, message 104 represents one of these blocks. In particular, message 104 is k symbols in length, where each symbol may be binary data, ternary data, quaternary data, any other suitable type of data, or any suitable combination thereof. Encoder 106 is used to encode message 104 to produce codeword 108. In some embodiments, encoder 106 is an LDPC encoder. However, based on the disclosure and teachings provided herein, it should be clear that encoder 106 may also be any other suitable encoder. Codeword 108 has a length of n symbols, where n>k.

Codeword 108 may be modulated or otherwise transformed by modulator 112 into a waveform suitable for transmission and/or storage on channel 116. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

Channel 116 refers to the physical medium through which the transmitted waveform passes or is stored on before being recovered at demodulator 120. For example, channel 116 may be a storage channel that represents a magnetic recording medium in a computer system environment. Channel 116 may represent a physical channel in a hard disk drive between a data write and a data read. The hard disk drive may be included in a device such as a personal computer, portable music player, or mobile phone. In another example, channel 116 may be a communications channel that represents the wireless propagation environment in a wireless communications environment. In the channel 116, a subset of the samples of the waveform that passes through the channel may be erased. For example, when channel 116 is a storage channel, certain parts of the storage device may be damaged, leading to detection of this phenomenon and subsequent erasure of this part of the data. Such erasure may be naturally produced by the channel or may be marked by the detection/decoder system at a later stage, as it may be advantageous to detect the damaged data portions and erase them on purpose. For example, the erasure of a part of data may occur in the erasure detector block 123. The output of channel 116 is processed by demodulator 120 to produce received samples 122. Demodulator 120 may use frequency filters, multiplication and integration by periodic functions, and/or any other suitable demodulation technique to demodulate and/or process the output of channel 116.

Received samples 122 contain information related to codeword 108 and generally correspond to the codeword 108 originally output by encoder 106 with a subset of symbols in error and/or in erasure. Erasure detector 123 detects the positions of the erased symbols in the received samples 122. When channel 116 represents a physical channel in a hard disk drive with a damaged part of data, erasure detector 123 may know where the damage occurred or attempt to detect the symbol positions that were erased or should be erased.

Decoder 124 processes received samples 122 to produce decoded message 126, which is an estimate of the original data message 104. In some embodiments, decoder 124 is a hard decision decoder, meaning that the decoder only receives a stream of bits. In other embodiments, decoder 124 is a soft decision decoder, meaning that in addition to receiving a stream of bits, the decoder also receives information about the reliability of each received bit value.

In some embodiments, decoder 124 implements erasure correcting codes. In some embodiments, decoder 124 corrects erasures using bit-flipping algorithms. In some embodiments, decoder 124 corrects erasures using forward-backward algorithms. In some embodiments, decoder 124 corrects erasures using message-passing algorithms. In some embodiments, decoder 124 implements any suitable combination of decoding algorithms.

First, decoder 124 selects a subset of the erased symbols and then selects candidate symbol values for each symbol in the subset. The set of all possible sequences for all possible subsets of the erased symbols is denoted by the set of sequences $S_i$ 125. Decoder 124 may iterate over the sequence set $S_i$ 125 until no erased symbols are left and decoding has been successful, producing decoded message 126. In general, decoder 124 may be used to iteratively correct erasure errors present in received samples 122, for example, due to transmission through channel 116.

Decoded message 126 is delivered to receiving user or application 128 after being processed by decoder 124. Receiving user or application 128 may correspond to the same device or entity as transmitting user or application 102, or receiving user or application 128 may correspond to a different device or entity. Further, receiving user or application 128 may be either co-located or physically separated from transmitting user or application 102. If decoder 124 corrects all errors and erasures that are induced by channel 116 (or marked in the erasure detector block 123) and other communications effects in communications system 100, then decoded message 126 is a logical replica of message 104. Otherwise, decoded message 126 may differ from the message 104, and decoder 124 may declare an error accordingly.

Figure 2A:
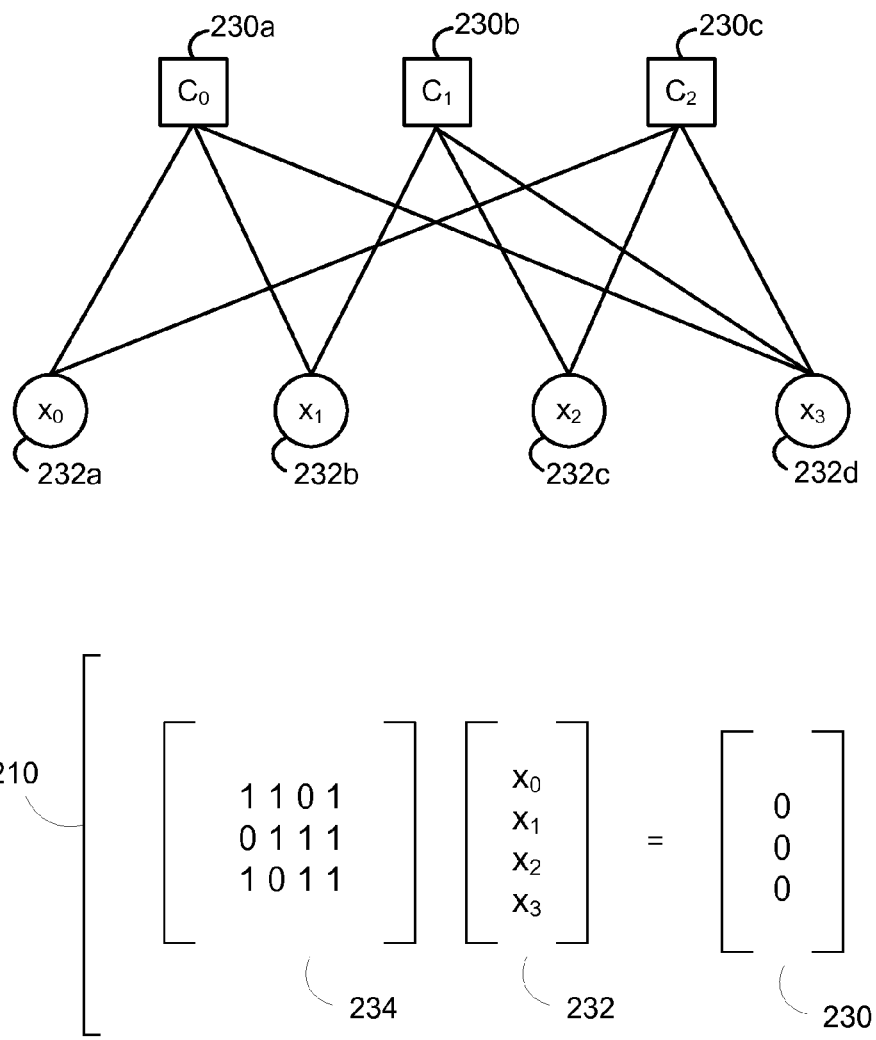
FIG. 2A is an illustrative example of a graphical representation of a low density parity check (LDPC) code.

FIG. 2A is an illustrative example of a graphical representation of an LDPC code. The codes processed by encoder 106 and decoder 124 (both of FIG. 1) are represented by a Tanner graph as depicted in FIG. 2A. The codeword symbols in FIG. 2A have binary values (0 or 1), or are bit symbols. The codeword consists of four (n) message nodes: 232a-232d ($x_0$-$x_3$, generally message nodes 232). Each message node is connected to at least one of three (r) check nodes 230a-230c ($c_0$-$c_2$, generally check nodes 230).

The connections between the message nodes 232 and check nodes 230 represent a parity check matrix 234 of size r×n, or 3×4. The entry in the $i^{th}$ row and $j^{th}$ column in the parity check matrix 234 is equal to the value of one if there is a connection between check node i and message node j, and zero otherwise. In equation 210, the parity matrix 234 is shown to take binary values, but it is to be understood by one of ordinary skill in the art, based on the disclosure and teachings herein, that these values may take on non-binary values that represent weights across different connections. As shown in equation 210, the product of the parity check matrix 234 and the bit values in codeword 232 (using an XOR sum, which is 0 if the sum is even and 1 otherwise) results in a zero-vector 230, which is a vector of size r×1 having all elements equal to zero.

Figure 2B:
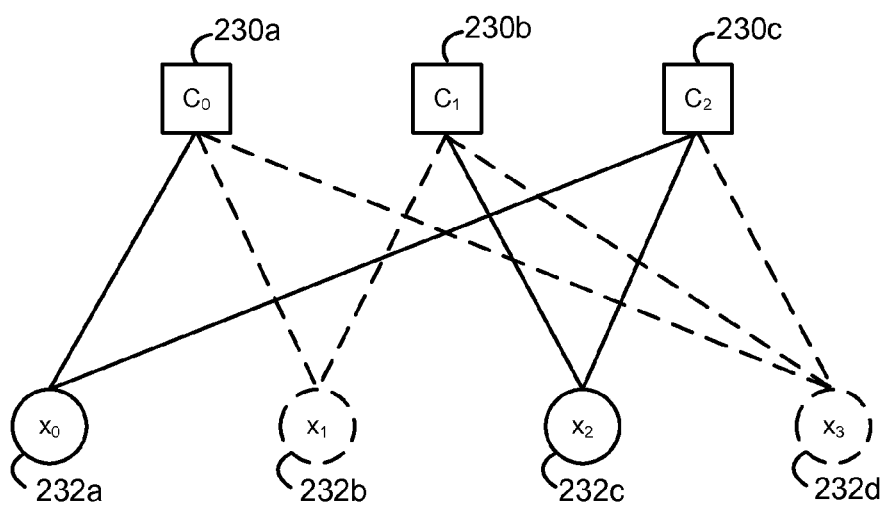
FIG. 2B is a graphical representation of the low density parity check code when several symbols have been erased, according to an illustrative embodiment of the invention.

FIG. 2B is a graphical representation of the LDPC code when several symbols have been erased, according to an illustrative embodiment of the invention. In FIG. 2B, message nodes $x_1$ 232b and $x_3$ 232d have been erased, thereby creating uncertainty in the received message. In this example, message node $x_1$ is connected to check nodes $c_0$ and $c_1$, while $x_3$ is connected to check nodes $c_0$, $c_1$, and $c_2$. Since check node $c_2$ has only one erased connection to $x_3$ (uncertainty degree 1), the erased message node $x_3$ is easily recovered by checking the values of the other message nodes connected to check node $c_2$ ($x_0$ and $x_2$). Message node $x_3$ is also connected to check nodes $c_0$ and $c_1$, which each have uncertain degree 2. Once message node $x_3$ is recovered, each check node $c_0$ and $c_1$ has only one erased connection to $x_1$, so that message node $x_1$ is similarly recovered from either check node $c_0$ or $c_1$.

The examples shown in FIGS. 2A and 2B are presented for illustrative purposes only. One of ordinary skill in the art, based on the disclosure and teachings herein, would understand that in real applications, the size of the parity check matrix 234 is typically larger, adding to the complexity required to successfully decode a message that includes erased data.

In addition, the example codeword shown consists of symbols which only take binary values (0 or 1, or bits). In general, symbols may take on other values as well. While the disclosure herein focuses primarily on the case when symbols take binary values, it is to be understood by one of ordinary skill in the art, based on the disclosure and teachings herein, that the systems and methods described herein are also extendable for codewords with symbols that take non-binary values as well.

Moreover, as will be explained in the subsequent disclosure and would be understood by one of ordinary skill in the art, the systems and methods presented herein may be used to decode codewords with a large number of symbols, many of which are erased and are positioned such that they may not be recovered as illustrated in the example shown in FIG. 2B.

Figure 3:
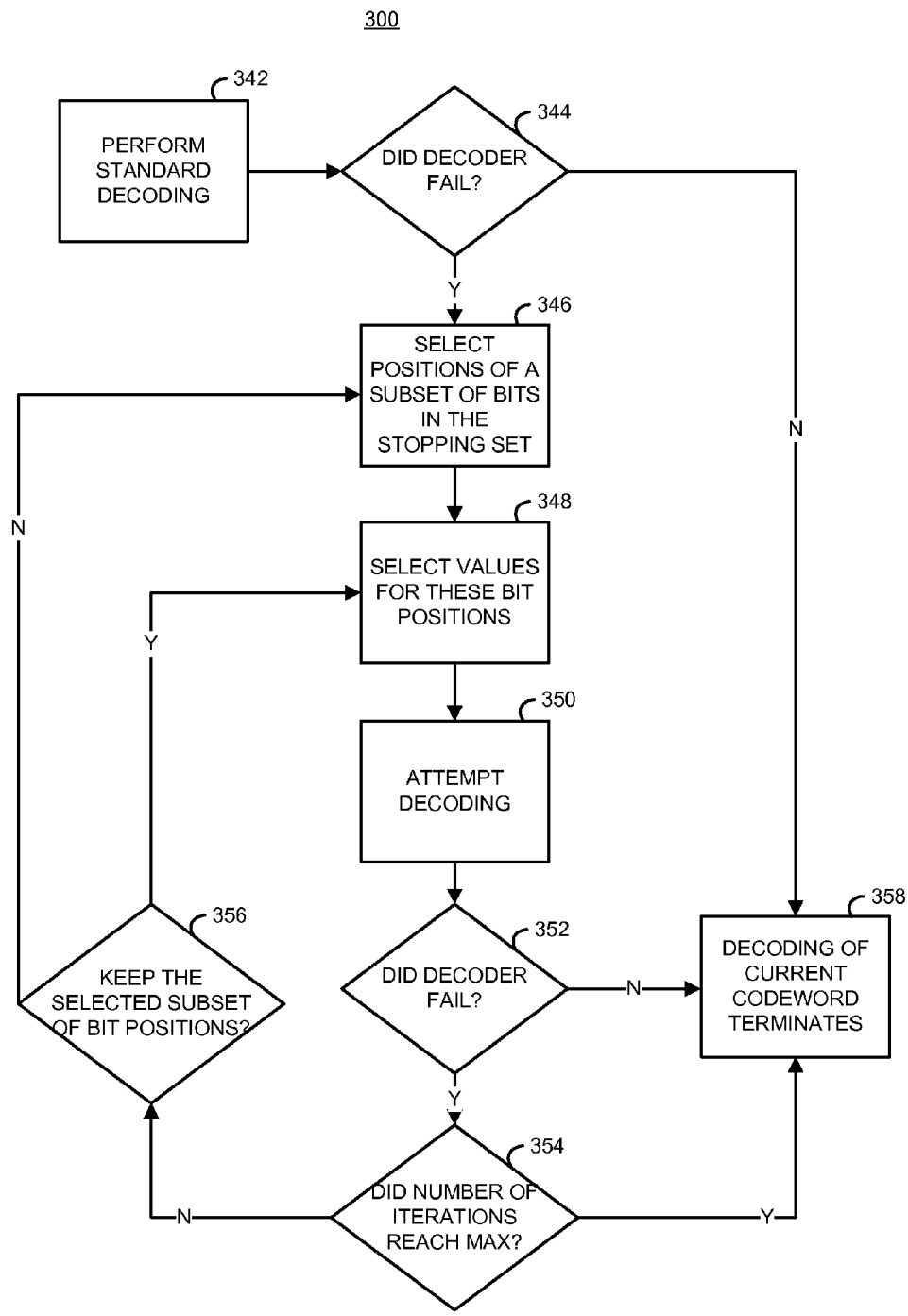
FIG. 3 is a flowchart of a method for decoding a codeword with erased bits, according to an illustrative embodiment of the invention.

FIG. 3 is a flowchart of a method 300 implemented by decoder 124 to decode a codeword with erased bits in accordance with some embodiments. The method includes the steps of performing decoding (342) and determining whether decoding fails (344). If decoding is successful, decoding of the current codeword terminates (358). Alternatively, if decoding fails, a subset of the erased bits is selected (346), values are selected for this subset (348), and decoding is attempted (350). Again, if decoding is successful, decoding of the current codeword terminates (358). Alternatively, if the decoding attempt fails, the decoder determines whether the number of iterations has reached a threshold value (354). If the iteration number has not reached threshold, decoder 124 then decides whether to keep the selected subset of bits (356). If decoder 124 keeps the selected subset, new values are selected for the subset (348). Otherwise, the decoder selects a new subset of bits (346).

First, at 342, decoder 124 performs decoding by using an iterative decoding algorithm such as belief propagation for LDPC codes or other iterative decoding algorithms as would be understood by one of ordinary skill in the art based on the disclosure and teachings herein. At 344, decoder 124 determines whether the decoding algorithm has failed.

In some embodiments, the failure of the decoding algorithm occurs when the decoder 124 reaches a subset of bits for which the decoder 124 is uncertain of the value of each bit in the subset, and no further reduction of the set of uncertain bits is possible using iterative decoding algorithms as would be understood by one of ordinary skill in the art. Uncertain bits arise when they have been erased, having been passed through channel 116 and/or erased later (e.g. in the erasure detection block 123). The set of uncertain bits which are not easily recovered is called the stopping set. Referring to Tanner graphs such as the one shown in FIG. 2B, the decoder reaches a stopping set, after performing iterative decoding algorithms as would be understood by one of ordinary skill in the art, when no check nodes 230 have just one erased connection, and at least one check node 230 has at least two erased connections. When the decoder 124 reaches a stopping set, each check node 230 in the set of check nodes has either zero erased connections or at least two erased connections. The set of check nodes with at least two erased connections is called the set of unsatisfied check nodes. Decoding is successful when the stopping set is empty; otherwise, decoding has failed.

At 346, if decoding fails (if the decoder 124 reaches a stopping set), the decoder 124 selects the positions of a subset of the bits in the stopping set. The number of bits in the subset is denoted L, and the selection of the L bit positions may be chosen in a variety of ways. In addition, as will be described in more detail in this disclosure, the value of L may change for different iterations.

Figure 4:
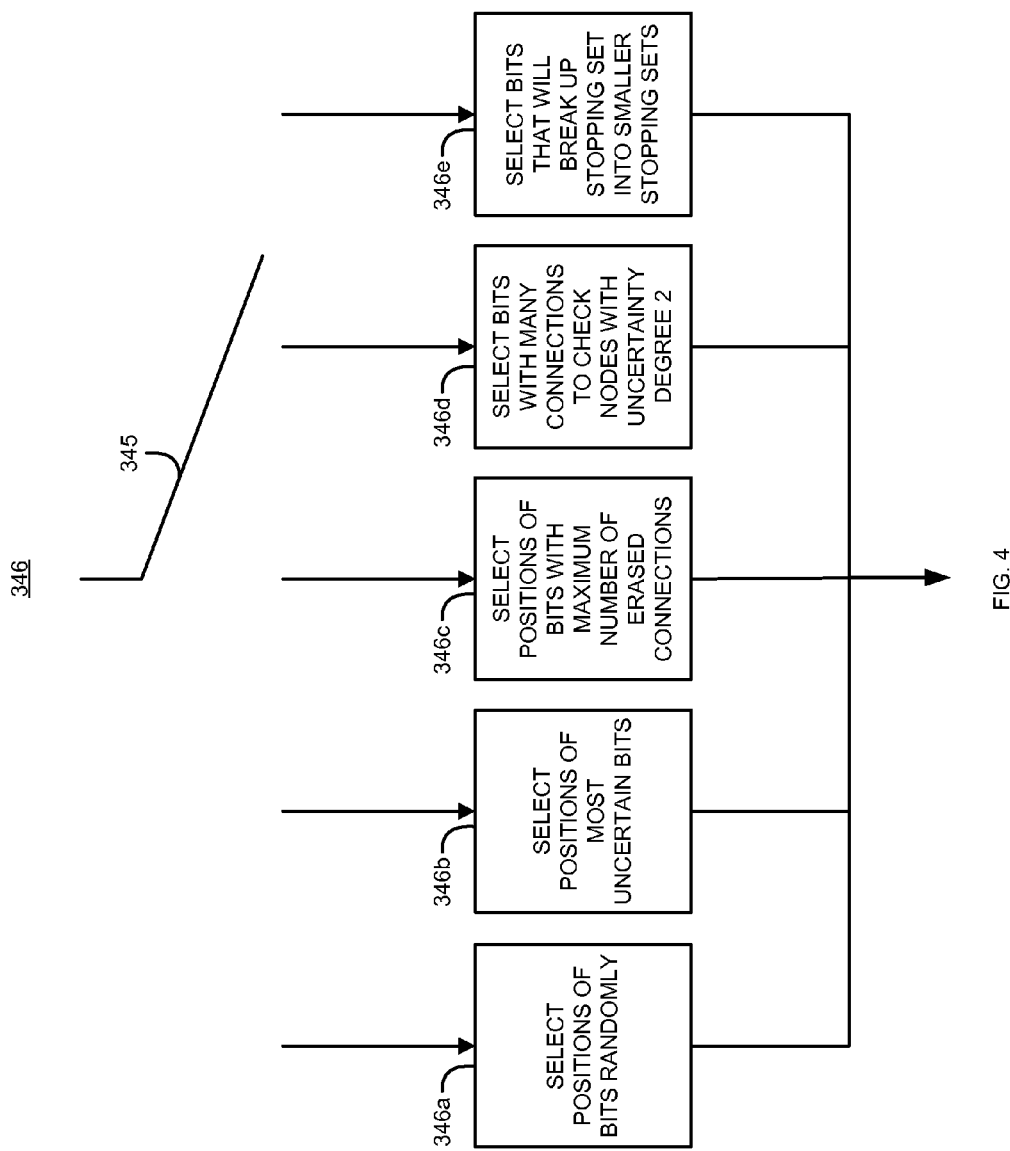
FIG. 4 is a flowchart of a method for selecting a subset of bit positions in a stopping set, according to an illustrative embodiment of the invention.

FIG. 4 is a flowchart of a method 346 for choosing a subset of bit positions in the stopping set, according to an illustrative embodiment of the invention. At 346, the decoder 124 implements one of several methods to select a subset of stopping set bit positions. The decoder 124 has dedicated circuitry to implement one, some, or all of the following techniques described herein.

The switch 345 illustrates how decoder 124 determines which technique (one of techniques 346a-346e) to use to select a subset of bit positions in the stopping set and may be implemented in hardware, software, firmware, or a combination thereof. In some embodiments, the switch 345 is pre-programmed by a user to select one of the techniques for a given iteration. For example, the switch 345 determines which technique to use based on a user-specified pattern, and the selection of techniques may dynamically change across iterations. In this case, the switch 345 adaptively selects one of the techniques in a given iteration based on observations of previous iterations.

If the technique 346a is chosen, the decoder 124 selects the positions of the L bits randomly.

Alternatively, if the technique 346b is chosen, the decoder 124 selects the positions of the most uncertain bits. In this case, the decoder 124 is a soft decoder, meaning that decoder 124 computes or receives information indicative of the relative degrees of uncertainty of the bits in the received samples. In some embodiments, the decoder 124 performs this computation by using sum-product algorithms, which compute the reliability of a decoded codeword by measuring the likelihood (using the log-likelihood ratio, or LLR) that each bit in the codeword takes on a particular value. The LLR is computed by the following equation:

$$LLR(x_j) = \log\left(\frac{Pr(x_j = 0 \mid \text{observed or selected value for } x_j)}{Pr(x_j = 1 \mid \text{observed or selected value for } x_j)}\right)$$

For an erased bit, LLR is initially zero because the probabilities in the numerator and denominator are the same. However, after an iteration of attempted decoding (with a selected value substituted in for an erased bit, as described later), the LLR values may change. The decoder 124 is more uncertain of the values for bits with LLR values near zero because an LLR value near zero means that the probabilities that the bit is 0 or 1 are nearly the same. Alternatively, a bit with a large positive LLR value indicates that the decoder is fairly certain that the bit value is 0, and a bit with a large negative LLR value indicates that the decoder is fairly certain that the bit value is 1. Thus, if the technique 346b is chosen, the decoder 124 selects the positions of the bits with LLR values near zero.

If technique 346c is chosen, the decoder 124 selects the positions of bits with the maximum number of erased connections. In this case, if the decoder is able to successfully decode this subset of bits, the number of revealed connections is large. This may also lead to a reduction in the number of unsatisfied check nodes and the revealing of erased bits outside of the selected subset. In some embodiments, the selection of the bit positions is performed based on those that are most likely to affect the largest number of bits in a small number of decoding iterations.

If technique 346d is chosen, the decoder 124 selects the positions of bits with many connections to check nodes with uncertainty degree 2. As illustrated in the example shown in FIG. 2B, this means that each recovered bit in the selected subset would recover at least another erased bit in the stopping set. In this way, it is possible for decoder 124 to recover a number of bits that is larger than L. In some embodiments, the decoder 124 selects the subset of L bit positions based on those that are most likely to maximize the number of recovered bits after a number of iterations.

If technique 346e is chosen, the decoder selects the subset of L bits that are most likely to break up the stopping set into smaller stopping sets. As would be understood by one of ordinary skill in the art, it is typically easier to decode a codeword with a small stopping set than a codeword with a large stopping set. Large stopping sets sometimes include smaller stopping sets. Selecting the subset of bit positions in a large stopping set such that the large stopping set is decomposed into multiple smaller stopping sets thus saves time because the smaller stopping sets are relatively easier to overcome than a large stopping set. In some embodiments, 346e involves two steps. First, the decoder finds all (or as many as possible) smallest stopping sets that are subsets of the larger stopping set. Then, the decoder determines which bits belong to the largest number of such subsets and selects these bit positions.

Figure 5:
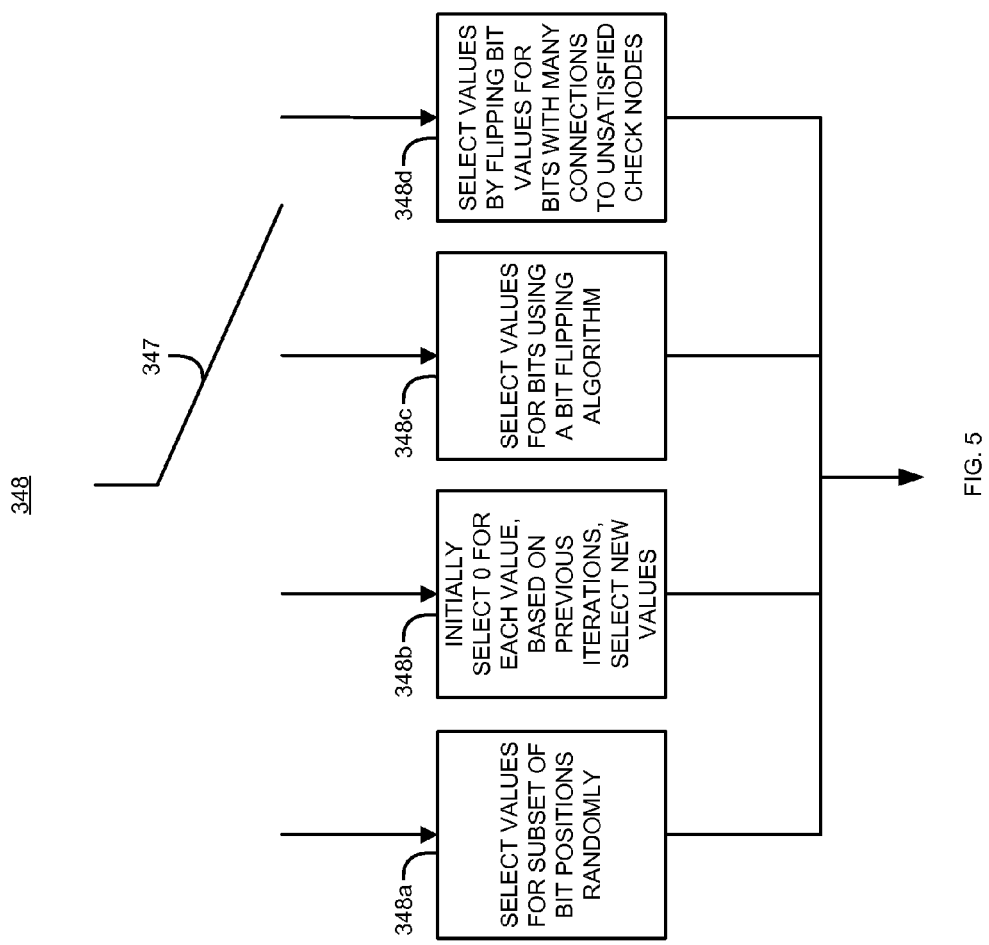
FIG. 5 is a flowchart of a method for selecting values for a subset of bit positions in the stopping set, according to an illustrative embodiment of the invention.

FIG. 5 is a flowchart of a method 348 for choosing values for the selected subset of bit positions in the stopping set, according to an illustrative embodiment of the invention. In method 348, which corresponds to step 348 in system 300, the decoder 124 implements one of several techniques to select values for the subset of bits selected at step 346. The decoder 124 has dedicated circuitry to implement one, some or all of the following techniques described herein.

The switch 347 illustrates how decoder 124 determines which technique (one of techniques 348a-348d) to use to select values for a subset of bit positions in the stopping set and may be implemented in hardware, software, firmware, or a combination thereof. In some embodiments, the switch 347 is pre-programmed by a user to select one of the techniques for a given iteration. For example, the switch 347 determines which technique to use based on a user-specified pattern, and the selection of techniques may dynamically change across iterations. In this case, the switch 347 adaptively selects one of the techniques in a given iteration based on observations of previous iterations.

If technique 348a is chosen, the decoder 124 selects the values for the L bits randomly.

Alternatively, if technique 348b is chosen, the decoder 124 initially selects 0 for every bit value in the subset. If this selection results in failed decoding, but with all erasures removed, this suggests that some errors are present but erasures are successfully removed. This would indicate that the choice of symbol positions was successful in that erasures were removed, but that the choice of symbol values was not correct. In this case, the decoder would keep the same subset of L bit positions and select different values from previous selected values.

If technique 348c is chosen, the decoder 124 selects values for the subset of bits by implementing a bit-flipping algorithm or a weighted bit-flipping algorithm. In this technique, if the previous selections of values result in failed decoding, but with all erasures removed, the bit-flipping algorithms describe a method of selecting which bit values to change from previous selections based on those that are most likely reduce the number of unsatisfied check nodes.

If technique 348d is chosen, the decoder 124 selects values for the subset of bits by changing, from previous iterations, the values for those bits that have a large number of connections to unsatisfied check nodes, and leaves the values for other bits unchanged.

The above description of how to select a subset of bit positions in the stopping set and values for this subset of bits applies to LDPC codes. It is to be understood by one of ordinary skill in the art, based on the disclosure and teachings herein, that the systems and methods described herein also apply to other codes.

Referring to FIG. 3, at 350, decoder 124 attempts decoding with the modified codeword, which includes the non-erased bits from the codeword and the selected sequence of values for the L uncertain bits. As in 342, the decoding in 350 uses decoding algorithms such as belief propagation for LDPC codes or other decoding algorithms as would be understood by one of ordinary skill in the art based on the disclosure and teachings herein. At 352, decoder 124 determines whether decoding with the modified codeword has failed. In some embodiments, failed decoding is manifested as reaching a stopping set.

If decoding with the modified codeword has failed, decoder 124 checks whether the number of iterations has reached a maximum at 354. This maximum number of iterations includes two thresholds: one threshold for how many different subsets to select, and one threshold for how many combinations of values to select for a given subset. In some embodiments, if either threshold is reached, then decoding terminates at 358. In other embodiments, termination requires reaching both thresholds. In some embodiments, the threshold values are pre-determined before decoding begins. In some embodiments, the decoder 124 changes the threshold values depending on how much bit information is revealed with an iteration.

If decoder 124 determines that another iteration is allowable, the decoder determines whether to keep the selected subset of L bit positions from the previous iteration at 356. If decoder 124 decides to keep the subset of bit positions, the decoder selects different values for the subset at 348. Otherwise, a new subset of bit positions is selected in the stopping set at 346. At this point, decoder 124 may keep the subset size L the same as in the previous iteration, or L may change.

Typically, there is a trade-off between the selection L and the amount of information that might be revealed in an iteration. For example, if a large L is selected, the decoder is less likely to select the correct values for those L bits in step 348. Furthermore, in some embodiments, the selection of L depends on the relative uncertainties of the bits in the stopping set. In some embodiments, the decoder 124 is a soft decoder and has information regarding the relative certainties of bit values. For example, after an extra decoding step, the stopping set may include a small number of very uncertain bits (meaning the LLR values for these bits are near zero) and a large number of more certain bits (meaning large positive or negative LLR values). In this case, the decoder 124 already has some information of which values are more likely to be correct for the more certain bit positions, and selection of a large number of more certain bits does not necessarily lead to a higher likelihood of selecting incorrect bit values.

Figure 6:
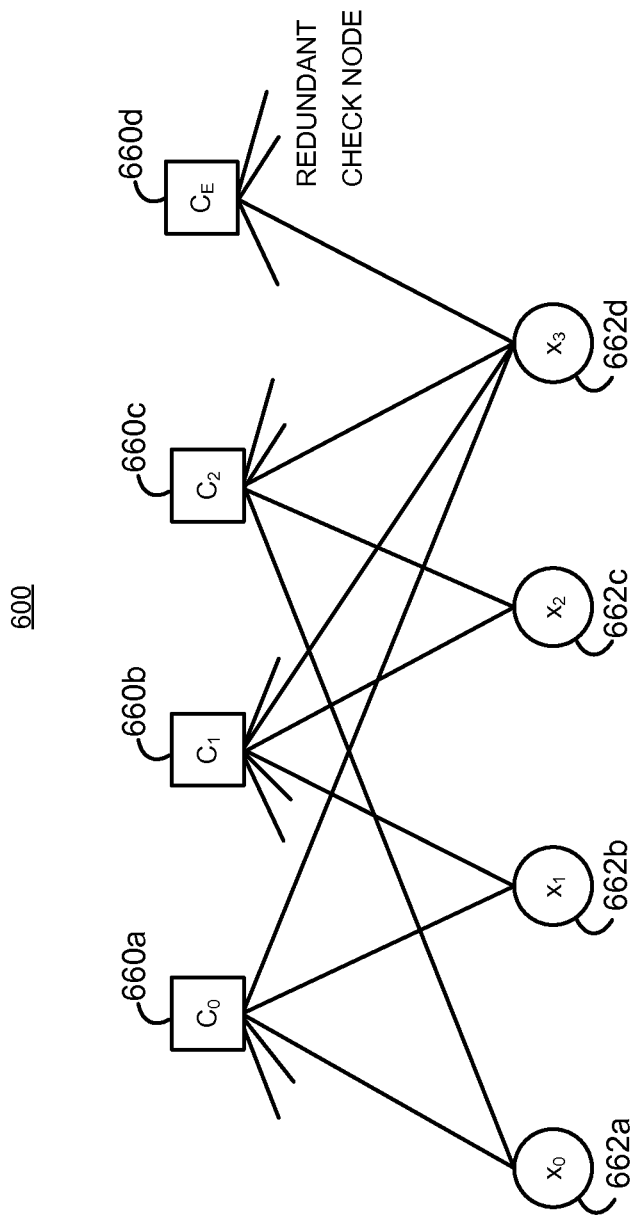
FIG. 6 is an illustrative example of a graphical representation of an LDPC code, including an additional check node that explicitly reveals the value of a message node, according to an illustrative embodiment of the invention.

FIG. 6 is an illustrative example of a graphical representation 600 of an LDPC code, where an additional check node has been added to explicitly reveal the value of a message node, according to an illustrative embodiment of the invention. In some embodiments, decoder 124 uses check nodes in addition to those that describe the parity check matrix 234. These additional check nodes are redundant, meaning that each additional check node is a linear combination of original check nodes. In other words, redundant rows, which are linear combinations of other rows, are added to the parity check matrix 234. In the example shown in FIG. 6, the codeword consists of four (n) message nodes 662a-662d ($x_0$-$x_3$, generally, message nodes 662). The check nodes 660a-660c ($c_0$-$c_2$, generally, check nodes 660) indicate the original check nodes.

If all four message nodes 662 are erased, then all three check nodes $c_0$-$c_2$ are unsatisfied because each has at least two erased connections. The short branches extending out of check nodes $c_0$-$c_2$ correspond to known connections, or connections to non-erased message nodes. In some embodiments, decoder 124 decodes the codeword by making use of redundant check node $c_E$ 660d, which corresponds to the XOR sum of check nodes $c_0$, $c_1$, and $c_2$ and explicitly reveals the value of message node $x_3$ if all other connections to $c_E$ are known.

In some embodiments, redundant check nodes such as $c_E$ are created by encoder 106 and are sent over the channel 116. In other embodiments, decoder 124 activates redundant check nodes as necessary in order to explicitly reveal the value of a message node in the stopping set. In some embodiments, redundant check nodes are created by encoder 106 and selectively activated by decoder 124.

Figure 7:
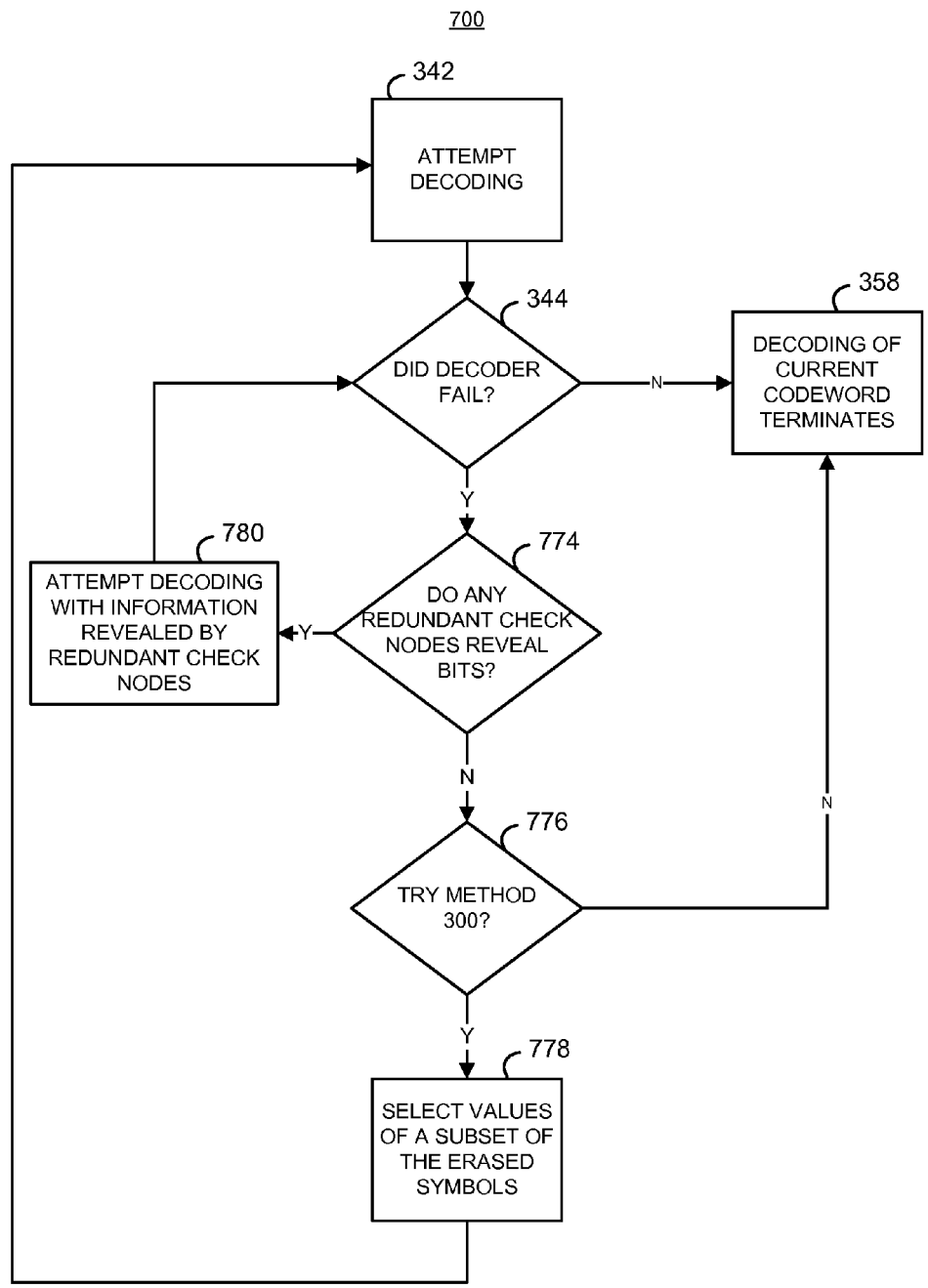
FIG. 7 is a flowchart of a method for decoding a codeword with erased bits, including the use of additional check nodes, according to an illustrative embodiment of the invention.

FIG. 7 is a flowchart of a method 700 for decoding a codeword with erased bits, including the use of additional check nodes, according to an illustrative embodiment of the invention. The method includes the steps of performing decoding (342) and determining whether decoding fails (344). If decoding is successful, decoding of the current codeword terminates (358). Alternatively, if decoding fails, the decoder 124 checks if one or more redundant check nodes reveal bits (774), and if so, attempt decoding with redundant check nodes (780). If the decoder 124 determines that redundant check nodes are not useful or not desirable, the decoder 124 attempts decoding by completing an iteration of method 300 illustrated in FIG. 3 (776 and 778).

First, at 342, as described in method 300, the decoder 124 performs decoding by using an iterative decoding algorithm such as belief propagation for LDPC codes or other iterative decoding algorithms as would be understood by one of ordinary skill in the art based on the disclosure and teachings herein. At 344, decoder 124 determines whether the decoding algorithm has failed. If decoding is successful, decoding of the current codeword terminates at 358.

If decoding fails, the decoder 124 determines whether using redundant check nodes would reveal any of the erased bits (774). As described in relation to FIG. 6, in some embodiments, the encoder 106 creates redundant check nodes. For example, in some embodiments, the encoder 106 creates redundant check nodes in order to explicitly reveal the value of each bit in the codeword. In some embodiments, a subset of bits in the codeword is more essential than another subset of bits. For example, a codeword may be redundantly encoded such that knowing an essential subset of bits in the codeword would reveal the rest of the codeword. In some embodiments, the encoder 106 creates redundant check nodes in order to explicitly reveal the value of each bit in the essential subset of bits in the codeword. In some embodiments, the decoder 124 determines which check nodes are redundant and uses only non-redundant check nodes when initially decoding at 342. In some embodiments, the decoder 124 activates redundant check nodes as necessary to explicitly reveal stopping set bit values.

If the decoder 124 determines that use of redundant check nodes will reveal stopping set bit values, decoding is attempted with the additional information that one or more redundant check nodes provided (780). For example, if redundant check nodes reveal bit values for a subset of erased bits, the modified codeword includes the subset of the erased bits replaced with these values and the original un-erased bits in the codeword.

Alternatively, if the decoder 124 determines that use of redundant check nodes would not reveal any bit values in the stopping set, the decoder 124 determines whether to perform an iteration of the method 300 (776). If the decoder 124 determines not to use method 300 (for example, if the number of iterations exceeds a threshold), decoding of the current codeword is terminated (358). Alternatively, if the decoder 124 determines to use method 300, values for a subset of the stopping set are chosen (778), and decoding is attempted again (342).

While various embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A decoder configured to:
receive a codeword transmitted over a channel;
process the codeword to identify and/or mark a set of locations in the codeword corresponding to erased codeword symbols;
select a subset of locations from the set of locations in the codeword;
select a sequence of symbol values from a plurality of symbol value sequences;
replace each of the erased codeword symbols in the subset of locations with a corresponding symbol value from the sequence of symbol values to produce a modified codeword;
attempt to decode the modified codeword;
determine if the decoding attempt fails;
select another subset of locations from the set of locations in the codeword, if the decoding attempt failed;
select another sequence of symbol values from the plurality of symbol value sequences;
replace each of the erased codeword symbols in the other subset of locations with a corresponding symbol value from the other sequence of symbol values to produce another modified codeword; and
attempt to decode the other modified codeword.

2. The decoder of claim 1, wherein the decoder is further configured to attempt to decode the modified codeword using a low-density-parity-check (LDPC) code.

3. The decoder of claim 2, wherein the decoder is further configured to select, as the subset of locations, the set of locations in the codeword having a largest number of connections to check nodes with at least two connections to erased codeword symbols.

4. The decoder of claim 2, wherein the decoder is further configured to use a check node that explicitly reveals an erased symbol value.

5. The decoder of claim 1, wherein the decoder is further configured to:
determine if the decoding attempt fails;
select another sequence of symbol values from the plurality of symbol value sequences to replace the first sequence of symbol values to produce another modified codeword, if the decoding attempt failed; and
attempt to decode the other modified codeword.

6. The decoder of claim 1, wherein the decoder is further configured to select the other subset of locations based on at least the subset of locations.

7. The decoder of claim 1, wherein the decoder is further configured to select, as the subset of locations, the set of locations in the codeword that increases a number of revealed symbols after one or more iterations of decoding.

8. The decoder of claim 1, wherein the decoder is further configured to select, as the subset of locations, a set of locations in the codeword that decomposes the set of erased codeword symbols into a plurality of smaller sets of erased codeword symbols.

9. The decoder of claim 1, wherein the symbols are bits.

10. The decoder of claim 1, wherein the erased codeword symbols are erased when the codeword is transmitted over the channel.

11. A method for correcting erasures in received codewords, comprising:
receiving a codeword transmitted over a channel;
processing the codeword to identify and/or mark a set of locations in the codeword corresponding to erased codeword symbols;
selecting, by a processor, a subset of locations from the set of locations in the codeword;
selecting, by the processor, a sequence of symbol values from a plurality of symbol value sequences;
replacing, by the processor, each of the erased codeword symbols in the subset of locations with a corresponding symbol value from the sequence of symbol values to produce a modified codeword;
attempting to decode the modified codeword;
determining if the decoding attempt fails;
selecting another subset of locations from the set of locations in the codeword, if the decoding attempt failed;
selecting another sequence of symbol values from the plurality of symbol value sequences;
replacing each of the erased codeword symbols in the other subset of locations to produce another modified codeword; and
attempting to decode the other modified codeword.

12. The method of claim 11, further comprising attempting to decode the modified codeword using an LDPC code.

13. The method of claim 12, wherein the processor selects, as the subset of locations, the set of locations in the codeword having a largest number of connections to check nodes with at least two connections to erased codeword symbols.

14. The method of claim 12, further comprising using a check node that explicitly reveals an erased symbol value.

15. The method of claim 11, further comprising:
determining if the decoding attempt fails;
selecting another sequence of symbol values from the plurality of symbol value sequences to replace the sequence of symbol values to produce another modified codeword, if the decoding attempt failed; and
attempting to decode the other modified codeword.

16. The method of claim 11, wherein selecting the other subset of locations is based on at least the subset of locations.

17. The method of claim 11, wherein the processor selects, as the subset of locations, the set of locations in the codeword that increase a number of revealed symbols after one or more iterations of decoding.

18. The method of claim 11, wherein the processor selects, as the subset of locations, a set of locations in the codeword that decomposes the set of erased codeword symbols into a plurality of smaller sets of erased codeword symbols.

19. The method of claim 11, wherein the symbols are bits.

20. The method of claim 11, wherein the erased codeword symbols are erased when the codeword is transmitted over the channel.

* * * * *